(12) United States Patent
Oh et al.

(10) Patent No.: US 9,806,245 B2
(45) Date of Patent: Oct. 31, 2017

(54) LIGHT EMITTING DEVICE PACKAGE, BACKLIGHT UNIT, AND METHOD OF MANUFACTURING LIGHT EMITTING DEVICE PACKAGE

(71) Applicant: LUMENS CO., LTD., Yongin-si, Gyeonggi-do (KR)

(72) Inventors: Seung-Hyun Oh, Gwangju-si (KR); Seung-Hoon Lee, Yongin-si (KR); Kang-Min Han, Suwon-si (KR)

(73) Assignee: LUMENS CO., LTD., Yongin-si (KR)

( * ) Notice: Subject to any disclaimer, the term of this patent is extended or adjusted under 35 U.S.C. 154(b) by 0 days.

(21) Appl. No.: 15/103,868

(22) PCT Filed: Jan. 30, 2015

(86) PCT No.: PCT/KR2015/001010
§ 371 (c)(1),
(2) Date: Jun. 11, 2016

(87) PCT Pub. No.: WO2015/115858
PCT Pub. Date: Aug. 6, 2015

(65) Prior Publication Data
US 2016/0329474 A1  Nov. 10, 2016

(30) Foreign Application Priority Data
Feb. 3, 2014  (KR) .................. 10-2014-0012277

(51) Int. Cl.
*H01L 33/00* (2010.01)
*H01L 33/62* (2010.01)
(Continued)

(52) U.S. Cl.
CPC ............ *H01L 33/62* (2013.01); *H01L 33/486* (2013.01); *H01L 33/58* (2013.01); *H01L 33/60* (2013.01);
(Continued)

(58) Field of Classification Search
None
See application file for complete search history.

(56) References Cited

U.S. PATENT DOCUMENTS 5,271,147 A * 12/1993 Ogata .................. H05K 3/3421
                                                         219/85.16
5,341,564 A *  8/1994 Akhavain ............... H01L 23/13
                                                         174/557
(Continued)

FOREIGN PATENT DOCUMENTS

KR    10-2006-0021750 A    3/2006
KR    10-2012-0084553 A    7/2012
KR    10-2013-0017831 A    2/2013

OTHER PUBLICATIONS

International Search Report dated May 1, 2015 in PCT/KR2015/001010, 4 pgs.

*Primary Examiner* — Andy Huynh
*Assistant Examiner* — Sitaramarao S Yechuri
(74) *Attorney, Agent, or Firm* — Ichthus International Law, PLLC

(57) ABSTRACT

Disclosed herein are a light emitting device package, a backlight unit, and a method of manufacturing a light emitting device package capable of being used for a display application or an illumination application. The light emitting device package includes: a flip-chip type light emitting device having a first pad and a second pad; a lead frame having a first electrode installed at one side of an electrode separation space and a second electrode installed at the other side thereof, and having the light emitting device seated thereon; a first bonding medium installed between the first pad and the first electrode so that the first pad of the light emitting device and the first electrode of the lead frame are electrically connected to each other; and a second bonding medium installed between the second pad and the second
(Continued)

electrode so that the second pad of the light emitting device and the second electrode of the lead frame are electrically connected to each other, wherein at least one first accommodating cup part accommodating the first bonding medium therein is formed in the first electrode of the lead frame, and at least one second accommodating cup part accommodating the second bonding medium therein is formed in the second electrode of the lead frame.

8 Claims, 16 Drawing Sheets

(51) Int. Cl.
  *H01L 33/48* (2010.01)
  *H01L 33/58* (2010.01)
  *H01L 33/60* (2010.01)
(52) U.S. Cl.
  CPC ............... *H01L 2224/16245* (2013.01); *H01L 2933/0066* (2013.01)

(56) References Cited

U.S. PATENT DOCUMENTS

| | | | | |
|---|---|---|---|---|
| 6,190,940 B1* | 2/2001 | DeFelice | ............... | H01L 21/563 257/737 |
| 6,362,435 B1* | 3/2002 | Downey | ........... | H01L 23/49811 174/260 |
| 6,686,664 B2* | 2/2004 | Caletka | ................ | B23K 3/0623 257/772 |
| 6,707,138 B2* | 3/2004 | Crowley | ........... | H01L 23/49513 257/139 |
| 7,067,350 B1* | 6/2006 | Liou | ....................... | H01L 24/13 257/E21.503 |
| 8,163,643 B1* | 4/2012 | Othieno | ........... | H01L 23/49513 257/678 |
| 8,253,224 B2* | 8/2012 | Hu | .................... | H01L 23/49524 257/666 |
| 2003/0174484 A1* | 9/2003 | Pai | ........................ | H05K 3/462 361/795 |
| 2011/0147899 A1* | 6/2011 | Dahilig | ................ | H01L 21/568 257/622 |
| 2011/0227207 A1* | 9/2011 | Yilmaz | ............. | H01L 23/49524 257/676 |
| 2012/0132933 A1* | 5/2012 | Watari | .................... | H01L 33/52 257/88 |
| 2012/0181555 A1* | 7/2012 | Yoo | ........................ | H01L 33/64 257/91 |
| 2012/0306065 A1* | 12/2012 | Bin Mohd Arshad | ............ | H01L 23/49548 257/676 |

* cited by examiner

LIGHT EMITTING DEVICE PACKAGE, BACKLIGHT UNIT, AND METHOD OF MANUFACTURING LIGHT EMITTING DEVICE PACKAGE

CROSS-REFERENCE TO RELATED APPLICATION(S)

This application is a National Stage entry of the International Application No. PCT/KR2015/001010, filed on Jan. 30, 2015, claiming priority to Korean Patent Application No. 10-2014-0012277, filed on Feb. 3, 2014, the content of which is incorporated herein by reference in its entirety.

TECHNICAL FIELD

The present invention relates to a light emitting device package, a backlight unit, and a method of manufacturing a light emitting device package, and more particularly, a light emitting device package, a backlight unit, and a method of manufacturing a light emitting device package capable of being used for a display application or an illumination application.

BACKGROUND ART

A light emitting diode (LED) indicates a kind of semiconductor device capable of implementing various colors of light by forming a PN diode using a compound semiconductor to configure a light emitting source. The LED has a long lifespan, may be miniaturized and become light, and may be driven at a low voltage. In addition, the LED is robust to impact and vibration, does not require a preheating time and complicated driving, and may be mounted in various shapes on a substrate or a lead frame and be then packaged, such that the LED may be modularized for several applications and be used in a backlight unit, various illumination apparatuses, or the like.

DISCLOSURE

Technical Problem

However, in a light emitting device package according to the related art, in the case in which a solder paste is applied onto a substrate, when an excessively small amount of solder paste is applied onto the substrate, adhesion strength between the substrate and a light emitting device is reduced, such that a short-circuit phenomenon may occur, when an excessively large amount of solder paste is applied onto the substrate, the solder paste is pressed by the light emitting device at the time of seating the light emitting device, such that the solder paste gets over an electrode separation line along the substrate to be spread, thereby generating a short-circuit.

In addition, in the light emitting device package according to the related art, since the light emitting device contacts the solder paste in a flow state to be cured, a light emitting axis of the light emitting device is inclined or misaligned, such that optical performance is deteriorated.

The present invention is to solve several problems including the problems as described above, and an object of the present invention is to provide a light emitting device package, a backlight unit, and a method of manufacturing a light emitting device package in which an adhesion property may be improved and a short-circuit may be prevented by forming accommodating cup parts capable of accommodating a solder paste therein in a substrate, and a light emitting axis may be accurately aligned by allowing a light emitting device to directly contact the substrate at the time of seating the light emitting device. However, this object is only an example, and the scope of the present invention is not limited thereto.

Technical Solution

According to an exemplary embodiment of the present invention, a light emitting device package includes: a flip-chip type light emitting device having a first pad and a second pad; a lead frame having a first electrode installed at one side of an electrode separation space and a second electrode installed at the other side thereof, and having the light emitting device seated thereon; a first bonding medium installed between the first pad and the first electrode so that the first pad of the light emitting device and the first electrode of the lead frame are electrically connected to each other; and a second bonding medium installed between the second pad and the second electrode so that the second pad of the light emitting device and the second electrode of the lead frame are electrically connected to each other, wherein at least one first accommodating cup part accommodating the first bonding medium therein is formed in the first electrode of the lead frame, and at least one second accommodating cup part accommodating the second bonding medium therein is formed in the second electrode of the lead frame.

A width or a length of an inlet of the first accommodating cup part may be smaller than a width or a length of the first pad and a width or a length of an inlet of the second accommodating cup part may be smaller than a width or a length of the second pad so that one portion of the first pad of the light emitting device directly contacts the first electrode of the lead frame and one portion of the second pad of the light emitting device directly contacts the second electrode of the lead frame.

The first accommodating cup part and the second accommodating cup part may be positioned within footprint regions of the first pad and the second pad. The first bonding medium and the second bonding medium may be solder pastes applied or dispensed onto the first accommodating cup part and the second accommodating cup part, respectively.

A plurality of first accommodating cup parts may be disposed in parallel with each other in a length direction or a width direction of the first pad. The first accommodating cup part and the second accommodating cup part may be formed of any one selected from the group consisting of at least quadrangular groove parts having a quadrangular cross section, polygonal groove parts having a polygonal cross section, and round groove parts having a round cross section, and the first accommodating cup part and the second accommodating cup part may have bottom slopes or side slopes so as to guide the first bonding medium and the second bonding medium in a direction that becomes distant from the electrode separation space. The light emitting device package may further include a reflection encapsulant filled in the electrode separation space to form an electrode separation wall and form a reflection cup part enclosing side circumferences of the light emitting device.

According to another exemplary embodiment of the present invention, a backlight unit includes: a flip-chip type light emitting device having a first pad and a second pad; a lead frame having a first electrode installed at one side of an electrode separation space and a second electrode installed at the other side thereof, and having the light emitting device seated thereon; a first bonding medium installed between the first pad and the first electrode so that the first pad of the light emitting device and the first electrode of the lead frame are electrically connected to each other; a second bonding medium installed between the second pad and the second electrode so that the second pad of the light emitting device and the second electrode of the lead frame are electrically connected to each other; and a light guide plate installed in a light path of the light emitting device, wherein at least one first accommodating cup part accommodating the first bonding medium therein is formed in the first electrode of the lead frame, and at least one second accommodating cup part accommodating the second bonding medium therein is formed in the second electrode of the lead frame.

According to still another exemplary embodiment of the present invention, a method of manufacturing a light emitting device package includes: preparing a lead frame having a first electrode installed at one side of an electrode separation space, a second electrode installed at the other side thereof, a first accommodating cup part formed in the first electrode, and a second accommodating cup part formed in the second electrode; applying or dispensing a first bonding medium onto the first accommodating cup part and applying or dispensing a second bonding medium onto the second accommodating cup part; seating a light emitting device on the lead frame so that one portion of the first pad directly contacts the first electrode and the other portion of the first pad is electrically connected to the first bonding medium and one portion of the second pad directly contacts the second electrode and the other portion of the second pad is electrically connected to the second bonding medium; and allowing the first bonding medium and the second bonding medium to reflow.

Advantageous Effects

According to some exemplary embodiments of the present invention configured as described above, the accommodating cup parts capable of accommodating the solder paste therein are formed in the substrate to increase an adhesion surface area, thereby making it possible to improve an adhesion property and to guide the solder paste in a direction that becomes distant from an electrode separation line, thereby making it possible to prevent a short-circuit phenomenon. In addition, the first and second pads of the light emitting device may directly contact the substrate at the time of seating the light emitting device, thereby making it possible to accurately arrange a light emitting axis, and the light emitting device is firmly fused to the bonding media in the accommodating cup parts, such that a fusion path is improved, thereby making it possible to prevent a chip lift defect. The scope of the present invention is not limited to the above-mentioned effects.

BEST MODE

Figure 1:
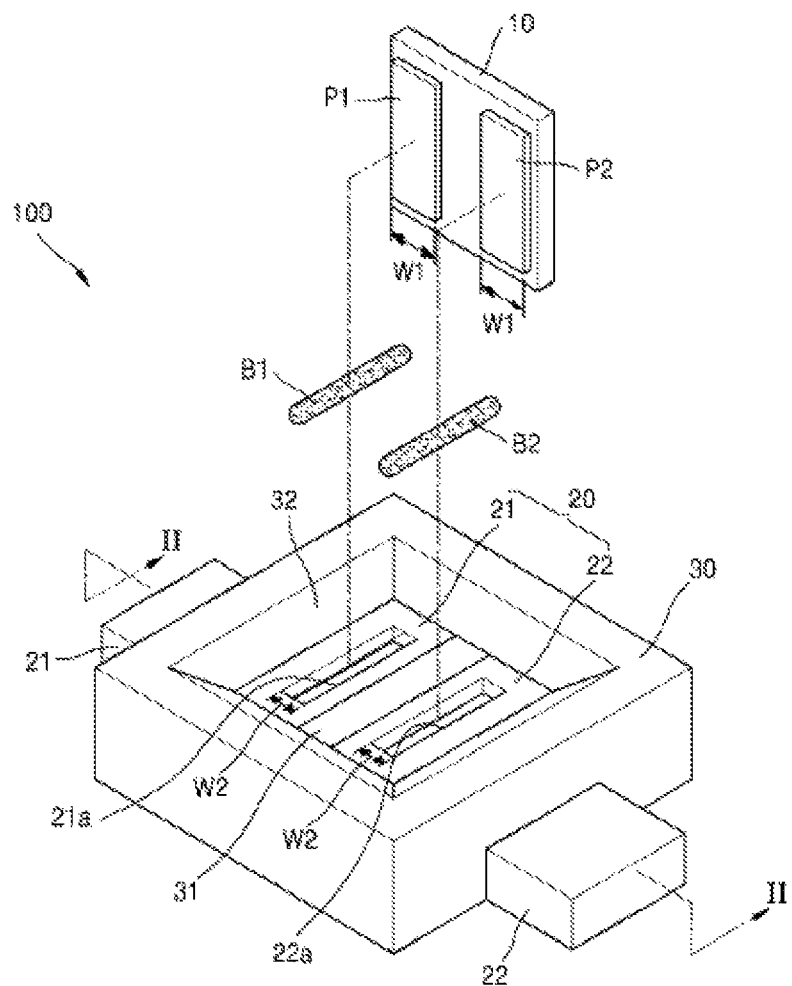
FIG. 1 is an exploded perspective view illustrating a light emitting device package according to some exemplary embodiments of the present invention.

Hereinafter, several exemplary embodiments of the present invention will be described in detail with reference to the accompanying drawings. Exemplary embodiments of the present invention will be provided only in order to further completely describe the present invention to those skilled in the art, the following exemplary embodiments may be modified into several other forms, and the scope of the present invention is not limited to the following exemplary embodiments. Rather, these exemplary embodiments make the present disclosure thorough and complete, and are provided in order to completely transfer the spirit of the present invention to those skilled in the art. In addition, thicknesses or sizes of the respective layers in the drawings have been exaggerated for convenience and clarity of explanation.

FIG. 1 is an exploded perspective view illustrating a light emitting device package 100 according to some exemplary embodiments of the present invention. In addition, FIG. 2 is a cross-sectional view of the light emitting device package 100 taken along line II-II of FIG. 1, and FIG. 3 is a plan view of the light emitting device package 100 of FIG. 1.

Figure 2:
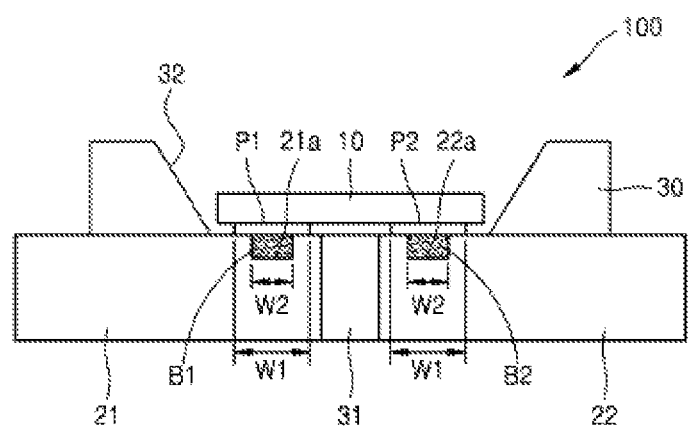
FIG. 2 is a cross-sectional view of the light emitting device package taken along line II-II of FIG. 1.
Figure 3:
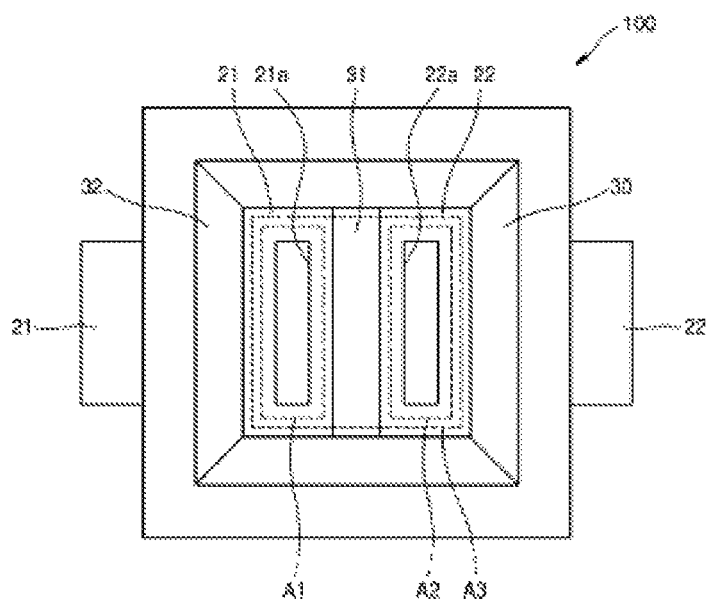
FIG. 3 is a plan view of the light emitting device package of FIG. 1.

First, as illustrated in FIGS. 1 to 3, the light emitting device package 100 according to some exemplary embodiments of the present invention may mainly include a light emitting device 10, a lead frame 20, a first bonding medium B1, and a second bonding medium B2. Here, the light emitting device 10 may be a flip-chip type light emitting diode (LED) having a first pad P1 and a second pad P2.

The light emitting device 10 may be formed of a semiconductor, as illustrated in FIG. 1. For example, LEDs formed of a nitride semiconductor and emitting blue light, green light, red light, and yellow light, an LED formed of a nitride semiconductor and emitting ultraviolet light, an LED formed of a nitride semiconductor and emitting infrared light, or the like, may be used. In addition, as the light emitting device 10, a light emitting device having any wavelength may be selected according to an application such as a display application, an illumination application, or the like.

Here, as the substrate for growth, an insulating substrate, a conductive substrate, or a semiconductor substrate may be used as needed. In addition, as a heterogeneous substrate, a sapphire substrate, a silicon carbide (SiC) substrate, or the like, has been mainly used, and the sapphire substrate has been mainly used as compared with the silicon carbide substrate which is expensive.

In addition, another support substrate may be used at the time of removing the substrate for growth. In this case, the support substrate may be bonded to an opposite side to an original growth substrate using a reflecting metal or a reflection structure may be inserted in the middle of a bonding layer, in order to improve light efficiency of an LED chip. Further, patterning of the substrate for growth forms a rugged part or a slope before or after growth of the LED structure on main surfaces (surfaces or both surfaces) or side surfaces of the substrate, thereby improving light extraction efficiency.

Further, although not illustrated, the light emitting device 10 may be a flip-chip type light emitting device having a signal transfer medium such as a bump, a solder, or the like, in addition to the pads P1 and P2. Further, all of light emitting devices in which bonding wires are applied to terminals or are applied to only a first terminal or a second terminal, such as a horizontal type light emitting device, a vertical type light emitting device, and the like, may be applied.

The first pad P1 and the second pad P2 may have various shapes in addition to a quadrangular shape illustrated in FIG. 1. For example, the first pad P1 and the second pad P2 may have a finger structure in which a plurality of fingers are provided on one arm. In addition, one light emitting device 10 may be installed on the lead frame 20, as illustrated in FIG. 1, or a plurality of light emitting devices 10 may be installed on the lead frame 20.

Meanwhile, the lead frame 20 may be a kind of substrate having a first electrode 21 installed at one side of an electrode separation space and a second electrode 22 installed at the other side thereof. The lead frame 20 may be formed of a material having appropriate mechanical strength and an insulating property so as to support the light emitting device 10 or accommodate the light emitting device 10 therein or a conductive material.

In addition, instead of the lead frame 20, a synthetic resin substrate formed of a resin, glass epoxy, or the like, may be used or a ceramic substrate may be used in consideration of thermal conductivity. Further, the lead frame 20 may be partially or entirely formed of one or more selected from the group consisting of at least an epoxy molding compound (EMC), polyimide (PI), ceramic, graphene, glass synthetic fiber, and combinations thereof in order to improve workability.

Meanwhile, the first bonding medium B1 may be a bonding member installed between the first pad P1 and the first electrode 21 so that the first pad P1 of the light emitting device 10 and the first electrode 21 of the lead frame 20 may be electrically connected to each other. In addition, the second bonding medium B2 may be a bonding member installed between the second pad P2 and the second electrode 22 so that the second pad P2 of the light emitting device 10 and the second electrode 22 of the lead frame 20 may be electrically connected to each other.

Here, the first bonding medium B1 and the second bonding medium B2 may be solder pastes or solder creams applied or dispensed onto a first accommodating cup part 21a and a second accommodating cup part 22a, respectively. In addition, the first bonding medium B1 and the second bonding medium B2 may be conductive bonding media, which are all curable materials that are in a flow state in which they may flow at the time of being bonded but are cured at the time of being cooled, heated, or dried, such as a solder, or the like.

Meanwhile, in the light emitting device package 100 according to some exemplary embodiments of the present invention, at least one first accommodating cup part 21a capable of accommodating the first bonding medium B1 therein may be formed in the first electrode 21 of the lead frame 20, and at least one second accommodating cup part 22a capable of accommodating the second bonding medium B2 therein may be formed in the second electrode 22 of the lead frame 20.

Here, as illustrated in FIG. 2, a width W2 or a length of an inlet of the first accommodating cup part 21a may be smaller than a width W1 or a length of the first pad P1 and a width W2 or a length of an inlet of the second accommodating cup part 22a may be smaller than a width W1 or a length of the second pad P2 so that one portion of the first pad P1 of the light emitting device 10 may directly contact the first electrode 21 of the lead frame 20 and one portion of the second pad P2 of the light emitting device 10 may directly contact the second electrode 22 of the lead frame 20.

Therefore, since one portion of the first pad P1 of the light emitting device 10 may directly contact the first electrode 21 of the lead frame 20 and one portion of the second pad P2 of the light emitting device 10 may directly contact the second electrode 22 of the lead frame 20, the first and second pads P1 and P2 of the light emitting device 10 may directly contact the lead frame 20 at the time of seating the light emitting device, such that the light emitting device 10 is not inclined or misaligned, thereby making it possible to accurately arrange a light emitting axis.

In addition, as illustrated in FIG. 3, the first accommodating cup part 21a and the second accommodating cup part 22a may be positioned within footprint regions A1 and A2 of the first pad P1 and the second pad P2. Therefore, an edge portion of the first pad P1 of the light emitting device 10 directly contacts the first electrode 21 of the lead frame 20, such that a gap is not present, and an edge portion of the second pad P2 of the light emitting device 10 directly contacts the second electrode 22 of the lead frame 20, such that a gap is not present. Accordingly, the first accommodating cup part 21a and the second accommodating cup part 22a are sealed, such that the first bonding medium B1 and the second bonding medium B2 are not leaked to the outside of the first accommodating cup part 21a and the second accommodating cup part 22a.

At the same time, it is possible to prevent other phosphors, a transparent encapsulant, a reflecting member, or other molding materials from permeating into the first accommodating cup part 21a and the second accommodating cup part 22a. It is obvious that the first accommodating cup part 21a and the second accommodating cup part 22a are positioned in a footprint region A3 of the light emitting device 10.

Here, for example, a footprint region of the first pad P1, indicates a region of the lead frame 20 on which the first pad P1 is projected on a plan view, may mean a bottom area occupied by the first pad P1 on the lead frame 20.

Figure 4:
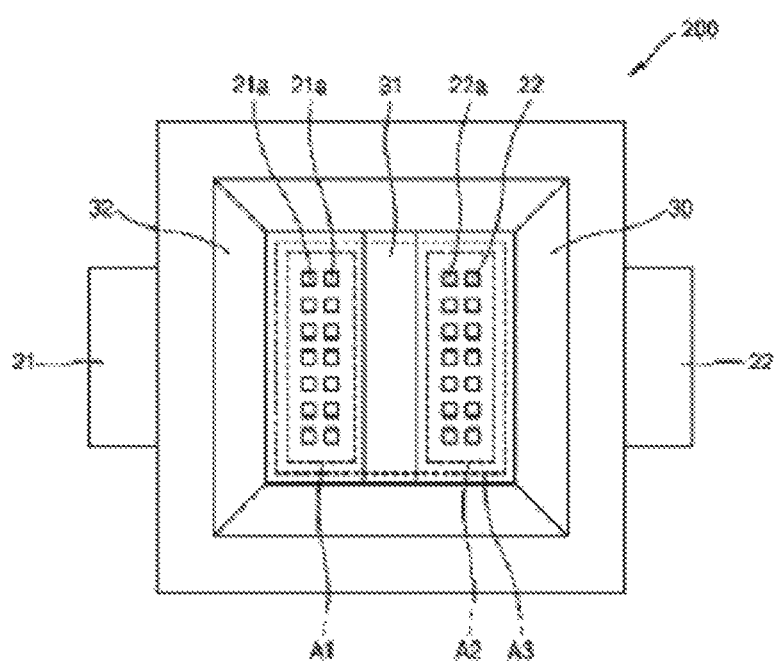
FIG. 4 is a plan view illustrating a light emitting device package according to some other exemplary embodiments of the present invention.
Figure 5:
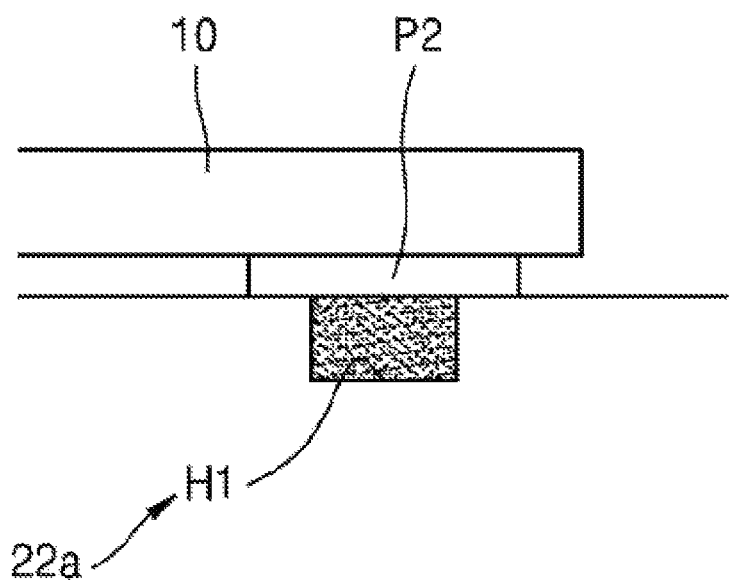
FIGS. 5 to 9 are cross-sectional views illustrating accommodating cup parts of a light emitting device package according to various exemplary embodiments.

FIG. 4 is a plan view illustrating a light emitting device package 200 according to some other exemplary embodiments of the present invention. As illustrated in FIG. 4, in the light emitting device package 200 according to some other exemplary embodiments of the present invention, a plurality of first accommodating cup parts 21a and a plurality of second accommodating cup parts 22a may be disposed in parallel with each other in a length direction and a width direction of the first pad P1, respectively.

As illustrated in FIG. 4, seven first accommodating cup parts 21a and seven second accommodating cup parts 22a are disposed in the length direction, respectively, and two first accommodating cup parts 21a and two second accommodating cup parts 22a are disposed in the width direction, respectively, such that a total number of each of the first accommodating cup parts 21a and the second accommodating cup parts 22a may be fourteen. Here, the numbers, positions, or the like, of the first accommodating cup parts 21a and the second accommodating cup parts 22a may be variously applied, for example, two, four, eight, or the like, and are not limited to the present drawing.

Figure 6:
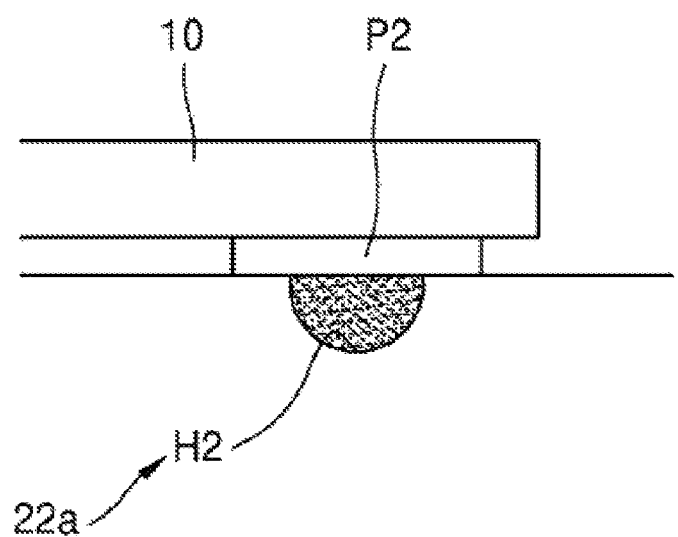
Figure 7:
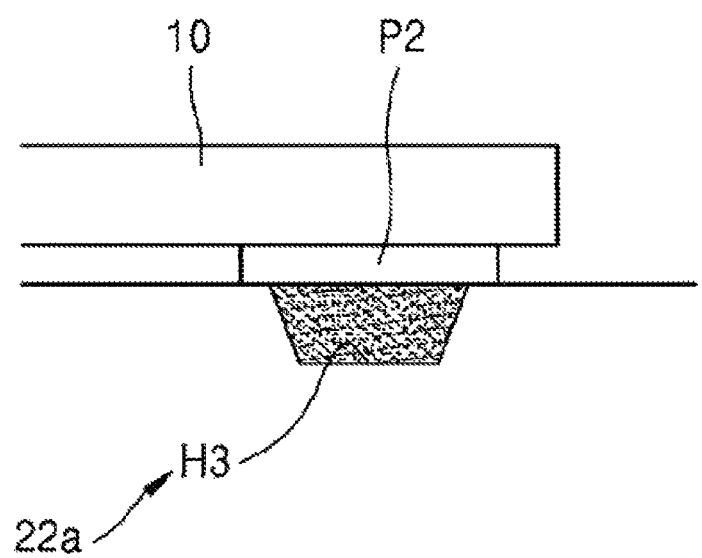

FIGS. 5 to 9 are cross-sectional views illustrating accommodating cup parts 21a and 22a of a light emitting device package according to various exemplary embodiments. As illustrated in FIGS. 5 to 9, the first accommodating cup part 21a and the second accommodating cup part 22a are not limited to quadrangular groove parts H1 having a quadrangular cross section as illustrated in FIGS. 2 to 5, but may be inverse rhomboid groove parts H3 having an inverse rhomboid cross section as illustrated in FIG. 7 or round groove parts H2 having a round cross section as illustrated in FIG. 6. In addition, although not illustrated, the first accommodating cup part 21a and the second accommodating cup part 22a may be polygonal groove parts having a polygonal cross section or groove parts having various geometric cross sections.

Figure 8:
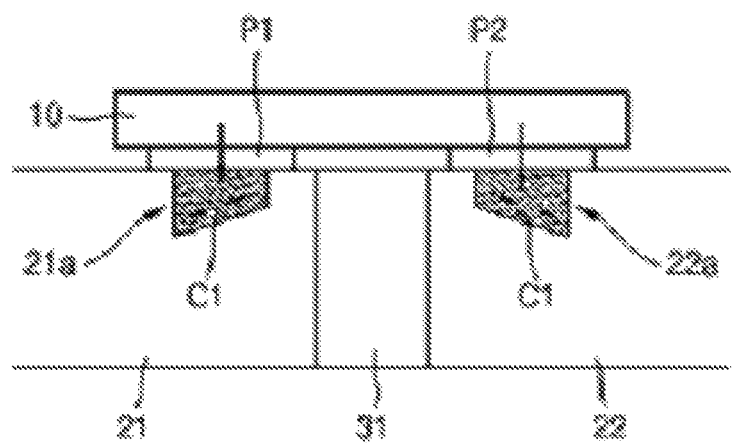

In addition, as illustrated in FIG. 8, the first accommodating cup part 21a and the second accommodating cup part 22a may have bottom slopes C1 so as to guide the first bonding medium B1 and the second bonding medium B2 in a direction that becomes distant from the electrode separation space. Here, the bottom slopes C1 may have a shape in which portions thereof close to the electrode separation space are high and portions thereof distant from the electrode separation space are low so as to guide the first bonding medium B1 and the second bonding medium B2 in the direction that becomes distant from the electrode separation space.

Figure 9:
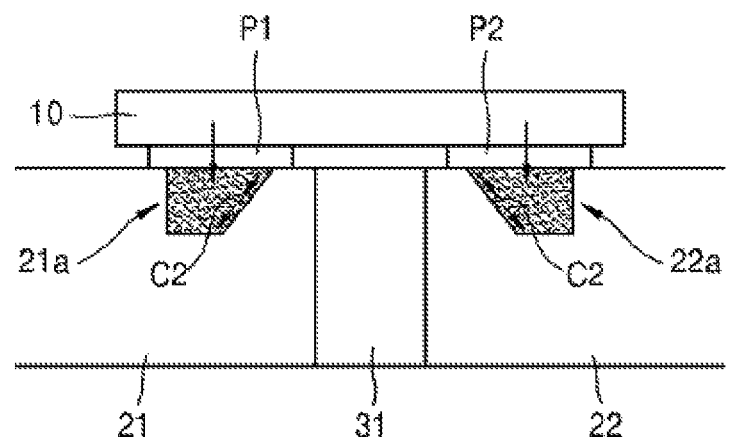

Here, the bottom slopes C1 are not necessarily limited to bottom surfaces. That is, as illustrated in FIG. 9, the first accommodating cup part 21a and the second accommodating cup part 22a may have side slopes C2 so as to guide the first bonding medium B1 and the second bonding medium B2 in the direction that becomes distant from the electrode separation space. Here, the side slopes C2 may have a shape in which portions thereof close to the electrode separation space are high and portions thereof distant from the electrode separation space are low so as to guide the first bonding medium B1 and the second bonding medium B2 in the direction that becomes distant from the electrode separation space. In addition, these slopes may be formed in various forms within the first accommodating cup part 21a and the second accommodating cup part 22a.

Meanwhile, as illustrated in FIGS. 1 to 4, the light emitting device packages 100 and 200 according to the present invention may further include a reflection encapsulant 30 filled in the electrode separation space to form an electrode separation wall 31 and form a reflection cup part 32 enclosing side circumferences of the light emitting device, and a filler 40 filled in the reflection cup part 32. Here, the electrode separation wall 31 and the reflection cup part 32 of the reflection encapsulant 30 may be molded and formed integrally with each other by a mold.

Here, the filler may be formed of one or more selected from the group consisting of at least silicon, transparent epoxy, a phosphor, and a combination thereof, which are materials having a relatively small particle size and being dense. In addition, the phosphor may include materials such as a quantum dot, and the like. As the phosphor, the above-mentioned oxide based material, nitride based material, silicate based material, and QD material may be singly used or a mixture thereof may be used.

In order to generate a difference in optical efficiency and light distribution characteristics, a light converting material may be positioned in a remote form. In this case, the light converting material is positioned together with translucent polymer, glass, or the like, depending on durability and heat resistance. Since a technology of applying the phosphor plays the largest role in determining optical characteristics in the light emitting device, various studies on control technologies of a thickness of a phosphor applied layer, uniform dispersion of the phosphor, and the like, have been conducted. The quantum dot may also be positioned in the LED chip or the light emitting device, similar to the phosphor, and be positioned between glass or translucent polymer materials to perform light conversion.

Figure 15:
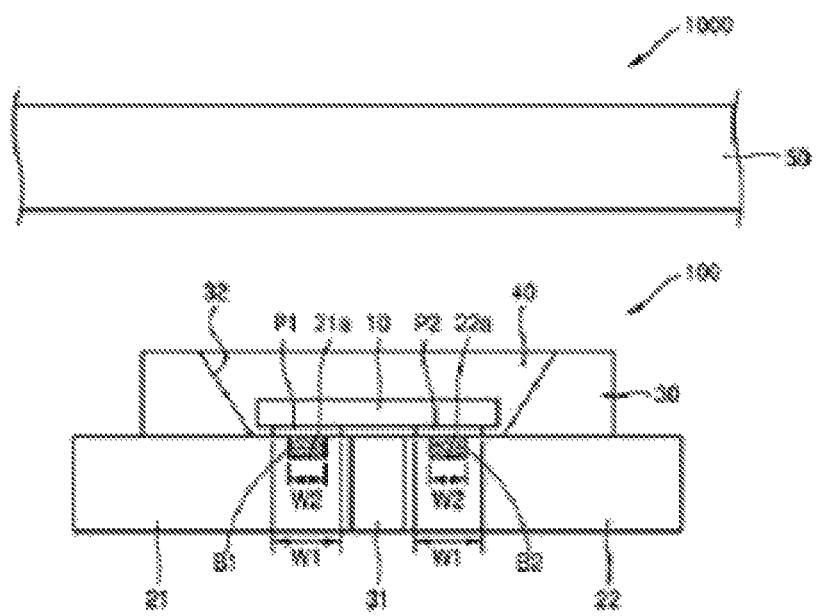
FIG. 15 is a cross-sectional view illustrating a backlight unit according to some exemplary embodiments of the present invention.

FIG. 15 is a cross-sectional view illustrating a backlight unit 1000 according to some exemplary embodiments of the present invention.

As illustrated in FIG. 15, the backlight unit 1000 according to some exemplary embodiments of the present invention may include a flip-chip type light emitting device 10 having a first pad P1 and a second pad P, a lead frame 20 having a first electrode 21 installed at one side of an electrode separation space and a second electrode 22 installed at the other side thereof, a first bonding medium B1 installed between the first pad P1 and the first electrode 21 so that the first pad P1 of the light emitting device 10 and the first electrode 21 of the lead frame 20 may be electrically connected to each other, a second bonding medium B2 installed between the second pad P2 and the second electrode 22 so that the second pad P2 of the light emitting device 10 and the second electrode 22 of the lead frame 20 may be electrically connected to each other, and a light guide plate 50 installed in a light path of the light emitting device 10, wherein at least one first accommodating cup part 21a capable of accommodating the first bonding medium B1 therein may be formed in the first electrode 21 of the lead frame 20, and at least one second accommodating cup part 22a capable of accommodating the second bonding medium B2 therein may be formed in the second electrode 22 of the lead frame 20.

Here, roles and configurations of the light emitting device 10, the lead frame 20, the first bonding medium B1, the second bonding medium B2, the first accommodating cup part 21a, and the second accommodating cup part 22a may be the same as those of the corresponding components of the light emitting device package 100 according to some exemplary embodiments of the present invention described above as illustrated in FIG. 1. Therefore, a detailed description for these components will be omitted.

In addition, the light guide plate 50 may be an optical member that may be formed of a translucent material so as to guide the light generated in the light emitting device 10. The light guide plate 50 may be installed in a path of the light generated in the light emitting device 10, and transfer the light generated in the light emitting device 10 to a wider area.

Here, although not illustrated, various diffusion sheets, a prism sheet, a filter, and the like, may be additionally installed above the light guide plate 50. In addition, various display panels such as a liquid crystal display (LCD) panel, and the like, may be installed above the light guide plate 50. Meanwhile, although not illustrated, the present invention may include an illumination apparatus including the light emitting device package 100 described above. Here, configurations and roles of components of the illumination apparatus according to some exemplary embodiments of the present invention may be the same as those of the corresponding components of the light emitting device package according to the present invention described above. Therefore, a detailed description for these components will be omitted.

Figure 10:
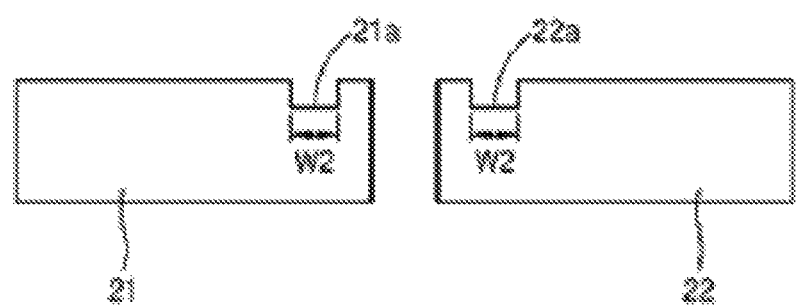
FIGS. 10 to 14 are cross-sectional views illustrating steps of a process of manufacturing a light emitting device package according to some exemplary embodiments of the present invention.

FIGS. 10 to 14 are cross-sectional views illustrating steps of a process of manufacturing a light emitting device package 100 according to some exemplary embodiments of the present invention. The steps of the process of manufacturing a light emitting device package 100 according to some exemplary embodiments of the present invention will be described with reference to FIGS. 10 to 14. First, as illustrated in FIG. 10, the lead frame 20 having the first electrode 21 installed at one side of the electrode separation space, the second electrode 22 installed at the other side thereof, the first accommodating cup part 21a formed in the first electrode 21, and the second accommodating cup part 22a formed in the second electrode 22 may be prepared.

Figure 11:
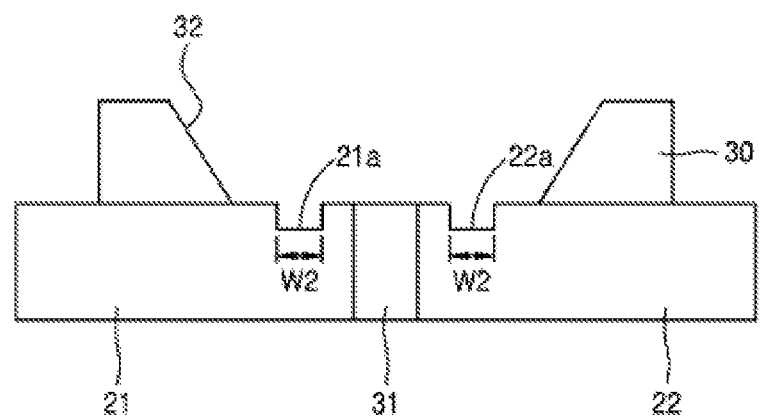
Figure 12:
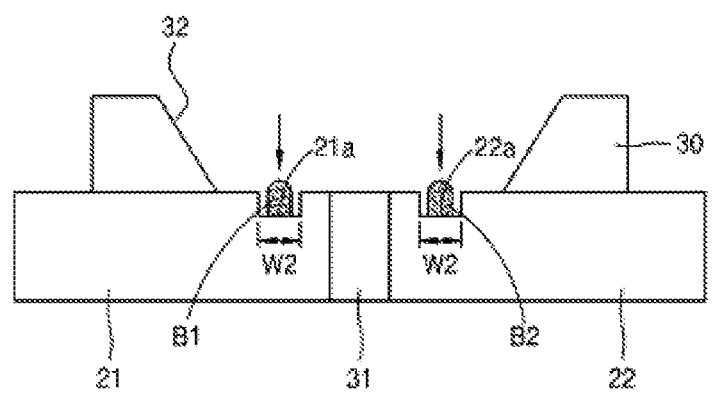

Then, as illustrated in FIG. 11, the electrode separation wall 31 and the reflection cup part 32 of the reflection encapsulant 30 may be molded integrally with each other using a mold. Then, as illustrated in FIG. 12, the first bonding medium B1 and the second bonding medium B2 such as a solder paste, or the like, may be applied or dispensed onto the first accommodating cup part 21a and the second accommodating cup part 22a by various printing methods such as an inkjet printing method, a stencil printing method, a squeeze printing method, and the like, as well as an ultra-precision transfer method or an ultra-precision stamping method.

Figure 13:
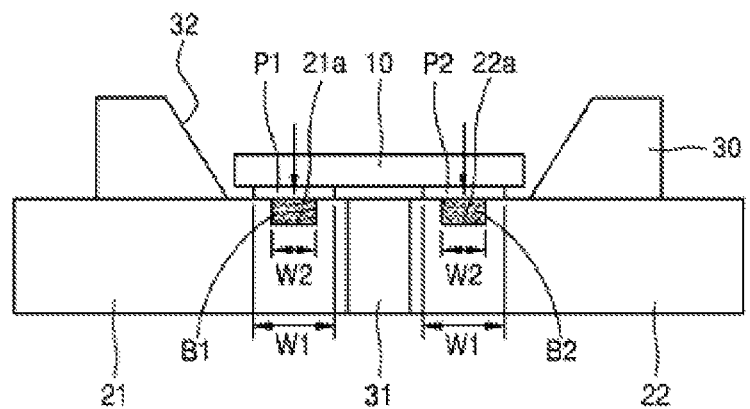
Figure 14:
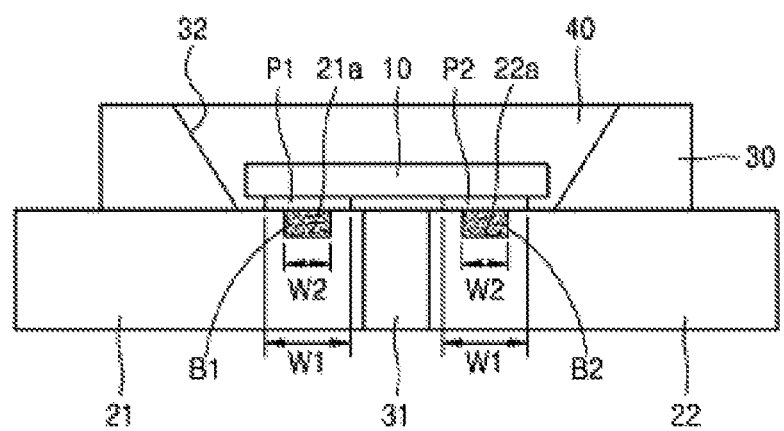

Then, as illustrated in FIG. 13, the light emitting device 10 may be seated on the lead frame 20 so that one portion of the first pad P1 may directly contact the first electrode 21 and the other portion of the first pad P1 may be electrically connected to the first bonding medium B1 and one portion of the second pad P2 may directly contact the second electrode 22 and the other portion of the second pad P2 may be electrically connected to the second bonding medium B2.

Here, since one portion of the first pad P1 of the light emitting device 10 may directly contact the first electrode 21 of the lead frame 20 and one portion of the second pad P2 of the light emitting device 10 may directly contact the second electrode 22 of the lead frame 20, the first and second pads P1 and P2 of the light emitting device 10 may directly contact the lead frame 20 at the time of seating the light emitting device, such that the light emitting device 10 is not inclined or misaligned, thereby making it possible to accurately arrange a light emitting axis, an edge portion of the first pad P1 of the light emitting device 10 directly contacts the first electrode 21 of the lead frame 20, such that a gap is not present, and an edge portion of the second pad P2 of the light emitting device 10 directly contacts the second electrode 22 of the lead frame 20, such that a gap is not present. Accordingly, the first accommodating cup part 21a and the second accommodating cup part 22a are sealed, such that the first bonding medium B1 and the second bonding medium B2 are not leaked to the outside of the first accommodating cup part 21a and the second accommodating cup part 22a.

In addition, the light emitting device 10 is firmly fused to the first bonding medium B1 and the second bonding medium B2 in the first accommodating cup part 21a and the second accommodating cup part 22a, such that a fusion path is improved, thereby making it possible to prevent a chip lift defect. The, as illustrated in FIG. 13, the first bonding medium B1 and the second bonding medium B2 may be heated to reflow, in order to being cured.

Figure 16:
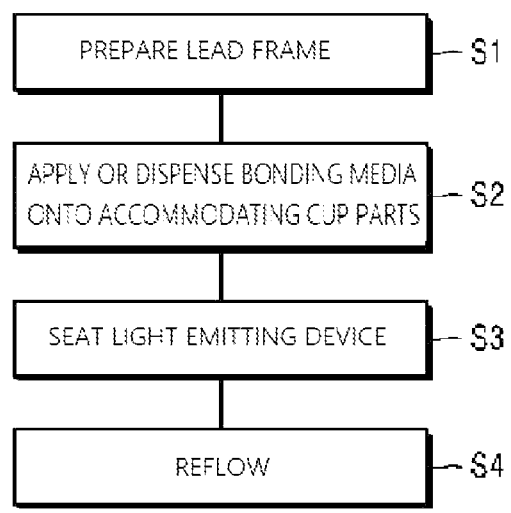
FIG. 16 is a flow chart illustrating a method of manufacturing a light emitting device package according to some exemplary embodiments of the present invention.

FIG. 16 is a flow chart illustrating a method of manufacturing a light emitting device package 100 according to some exemplary embodiments of the present invention. As illustrated in FIGS. 10 to 16, the method of manufacturing a light emitting device package 100 according to some exemplary embodiments of the present invention may include preparing a lead frame 20 having a first electrode 21 installed at one side of an electrode separation space, a second electrode 22 installed at the other side thereof, a first accommodating cup part 21a formed in the first electrode 21, and a second accommodating cup part 22a formed in the second electrode 22 (S1), applying or dispensing a first bonding medium B1 onto the first accommodating cup part 21a and applying or dispensing a second bonding medium B2 onto the second accommodating cup part 22a (S2), seating a light emitting device 10 on the lead frame 20 so that one portion of the first pad P1 may directly contact the first electrode 21 and the other portion of the first pad P1 may be electrically connected to the first bonding medium B1 and one portion of the second pad P2 may directly contact the second electrode 22 and the other portion of the second pad P2 may be electrically connected to the second bonding medium B2 (S3), and allowing the first bonding medium B1 and the second bonding medium B2 to reflow (S4).

Although the present invention has been described with reference to exemplary embodiments illustrated in the accompanying drawings, it is only an example. It will be understood by those skilled in the art that various modifications and equivalent other exemplary embodiments are possible from the present invention. Accordingly, the actual technical protection scope of the present invention is to be defined by the following claims.

INDUSTRIAL APPLICABILITY

According to some exemplary embodiments of the present invention configured as described above, the accommodating cup parts capable of accommodating the solder paste therein are formed in the substrate to increase an adhesion surface area, thereby making it possible to improve an adhesion property and to guide the solder paste in a direction that becomes distant from an electrode separation line, thereby making it possible to prevent a short-circuit phenomenon. In addition, the first and second pads of the light emitting device may directly contact the substrate at the time of seating the light emitting device, thereby making it possible to accurately arrange a light emitting axis, and the light emitting device is firmly fused to the bonding media in the accommodating cup parts, such that a fusion path is improved, thereby making it possible to prevent a chip lift defect. Therefore, a yield of a product may be increased and performance of the product may be improved.

The invention claimed is:

1. A light emitting device package comprising:
a light emitting device including a first pad and a second pad;
a lead frame including a first electrode disposed at one side of an electrode separation space and a second electrode disposed at the other side of the electrode separation space, and the lead frame having the light emitting device seated thereon;
a first bonding medium disposed between the first pad of the light emitting device and the first electrode of the lead frame such that the first pad of the light emitting device and the first electrode of the lead frame are electrically connected to each other; and
a second bonding medium disposed between the second pad of the light emitting device and the second electrode of the lead frame such that the second pad of the light emitting device and the second electrode of the lead frame are electrically connected to each other, wherein at least one first accommodating cup part configured to accommodate the first bonding medium therein is formed in the first electrode of the lead frame, and at least one second accommodating cup part configured to accommodate the second bonding medium therein is formed in the second electrode of the lead frame, wherein a width or a length of an inlet of the at least one first accommodating cup part is smaller than a width or a length of the first pad and a width or a length of an inlet of the at least one second accommodating cup part is smaller than a width or a length of the second pad of the light emitting device such that one portion of the first pad of the light emitting device directly contacts the first electrode of the lead frame and one portion of the second pad of the light emitting device directly contacts the second electrode of the lead frame, and wherein the first bonding medium is housed in the at least one first accommodating cup part so that the one portion of the first pad of the light emitting device can be directly contacted to the first electrode of the lead frame, and the second bonding medium is housed in the at least one second accommodating cup part so that the one portion of the second pad of the light emitting device can be directly contacted to the second electrode of the lead frame.

2. The light emitting device package of claim 1, wherein the at least one first accommodating cup part and the at least one second accommodating cup part are positioned within footprint regions of the first pad and the second pad of the light emitting device, respectively.

3. The light emitting device package of claim 1, wherein the first bonding medium and the second bonding medium each comprise solder pastes applied or dispensed onto the at least one first accommodating cup part and the at least one second accommodating cup part, respectively.

4. The light emitting device package of claim 1, wherein a plurality of first accommodating cup parts is disposed in parallel with each other in a length direction or a width direction of the first pad of the light emitting device.

5. The light emitting device package of claim 1, wherein:
the at least one first accommodating cup part and the at least one second accommodating cup part each comprise any one selected from the group consisting of: at least quadrangular groove parts having a quadrangular cross section, polygonal groove parts having a polygonal cross section, and round groove parts having a round cross section, and
the at least one first accommodating cup part and the at least one second accommodating cup part each have bottom slopes or side slopes so as to guide the first bonding medium and the second bonding medium in a direction that becomes distant from the electrode separation space.

6. The light emitting device package of claim 1, further comprising a reflection encapsulant filled in the electrode separation space to form an electrode separation wall and form a reflection cup part enclosing side circumferences of the light emitting device.

7. A backlight unit comprising:
a light emitting device including a first pad and a second pad;
a lead frame having a first electrode disposed at one side of an electrode separation space and a second electrode disposed at the other side of the electrode separation space, and the lead frame having the light emitting device seated thereon;
a first bonding medium disposed between the first pad and the first electrode such that the first pad of the light emitting device and the first electrode of the lead frame are electrically connected to each other;
a second bonding medium disposed between the second pad and the second electrode such that the second pad of the light emitting device and the second electrode of the lead frame are electrically connected to each other; and
a light guide plate disposed in a light path of the light emitting device, wherein at least one first accommodating cup part configured to accommodate the first bonding medium therein is formed in the first electrode of the lead frame, and at least one second accommodating cup part configured to accommodate the second bonding medium therein is formed in the second electrode of the lead frame, wherein a width or a length of an inlet of the at least one first accommodating cup part is smaller than a width or a length of the first pad of the light emitting device and a width or a length of an inlet of the at least one second accommodating cup part is smaller than a width or a length of the second pad of the light emitting device such that one portion of the first pad of the light emitting device directly contacts the first electrode of the lead frame and one portion of the second pad of the light emitting device directly contacts the second electrode of the lead frame, and wherein the first bonding medium is housed in the at least one first accommodating cup part so that the one portion of the first pad of the light emitting device can be directly contacted to the first electrode of the lead frame, and the second bonding medium is housed in the at least one second accommodating cup part so that the one portion of the second pad of the light emitting device can be directly contacted to the second electrode of the lead frame.

8. A method of manufacturing a light emitting device package, the light emitting device package including: a light emitting device having a first pad and a second pad; a lead frame having a first electrode disposed at one side of an electrode separation space and a second electrode disposed at the other side of the electrode separation space; a first bonding medium disposed between the first pad of the light emitting device and the first electrode of the lead frame so that the first pad of the light emitting device and the first electrode of the lead frame are electrically connected to each other; and a second bonding medium disposed between the second pad of the light emitting device and the second electrode of the lead frame so that the second pad of the light emitting device and the second electrode of the lead frame are electrically connected to each other, the method comprising:
preparing the lead frame in which at least one first accommodating cup part configured to accommodate the first bonding medium therein is formed in the first electrode of the lead frame and at least one second accommodating cup part configured to accommodate the second bonding medium therein is formed in the second electrode of the lead frame;
applying or dispensing the first bonding medium onto the at least one first accommodating cup part and applying or dispensing the second bonding medium onto the at least one second accommodating cup part;

seating the light emitting device on the lead frame such that one portion of the first pad of the light emitting device directly contacts the first electrode of the lead frame and the other portion of the first pad of the light emitting device is electrically connected to the first bonding medium and one portion of the second pad of the light emitting device directly contacts the second electrode of the lead frame and the other portion of the second pad of the light emitting device is electrically connected to the second bonding medium; and allowing the first bonding medium and the second bonding medium to reflow, wherein a width or a length of an inlet of the at least one first accommodating cup part is smaller than a width or a length of the first pad of the light emitting device and a width or a length of an inlet of the at least one second accommodating cup part is smaller than a width or a length of the second pad of the light emitting device, such that the one portion of the first pad of the light emitting device directly contacts the first electrode of the lead frame and the one portion of the second pad of the light emitting device directly contacts the second electrode of the lead frame, and wherein the first bonding medium is housed in the at least one first accommodating cup part so that the one portion of the first pad of the light emitting device can be directly contacted to the first electrode of the lead frame, and the second bonding medium is housed in the at least one second accommodating cup part so that the one portion of the second pad of the light emitting device can be directly contacted to the second electrode of the lead frame.

* * * * *